United States Patent [19]
Stuck

[11] Patent Number: 5,977,621
[45] Date of Patent: Nov. 2, 1999

[54] POWER SEMICONDUCTOR MODULE

[75] Inventor: Alexander Stuck, Wettingen, Switzerland

[73] Assignee: ABB Research Ltd, Zurich, Switzerland

[21] Appl. No.: 08/935,110

[22] Filed: Sep. 29, 1997

[30] Foreign Application Priority Data

Dec. 2, 1996 [DE] Germany .............. 196 49 798

[51] Int. Cl.⁶ .................................. H01L 23/16
[52] U.S. Cl. .................... 257/683; 257/687; 257/788
[58] Field of Search ........................ 257/683, 687, 257/678, 787, 788, 679

[56] References Cited

U.S. PATENT DOCUMENTS 5,744,860  4/1998  Bayerer et al. .............. 257/683

FOREIGN PATENT DOCUMENTS

| | | |
|---|---|---|
| 0 308 676 A2 | 3/1989 | European Pat. Off. . |
| 0 597 144 A1 | 5/1994 | European Pat. Off. . |
| 0 608 051 A2 | 7/1994 | European Pat. Off. . |
| 0 723 292 A2 | 7/1996 | European Pat. Off. . |
| 41 35 183 A1 | 5/1992 | Germany . |
| 60-177658 | 9/1985 | Japan ........................ 257/683 |

OTHER PUBLICATIONS

T. Stockmeier, et al., "Reliable 1200 Amp 2500 V IGBT Modules for Traction Applications," IEE IGBT Propulsion Drives Colloquium, Apr. 25, 1995, pp. 1–13.

Primary Examiner—Peter Toby Brown
Assistant Examiner—Roy Potter
Attorney, Agent, or Firm—Oblon, Spivak, McClelland, Maier & Neustadt, P.C.

[57] ABSTRACT

A power semiconductor module is specified in which a layer of foam is arranged under the housing cover in the housing. The foam not only enables mechanical support of the potting compound, so that the latter is prevented from becoming detached, but can also absorb a large pressure increase in the event of a short circuit by virtue of compression. In this way, a compensating volume is created without the housing being destroyed. The housing remains closed and no material is hurled into the surroundings.

18 Claims, 1 Drawing Sheet

POWER SEMICONDUCTOR MODULE

BACKGROUND OF THE INVENTION

1. Field of the Invention

The invention relates to the field of power semiconductor electronics. It is based on a power semiconductor module according to the preamble of the first claim.

2. Discussion of Background

Such a power semiconductor module is already described in European Patent Application EP 0 597 144 A1. Power semiconductor modules of the generic type comprise a housing in which at least one semiconductor chip is arranged on a baseplate, which may also simultaneously be used for cooling purposes. The semiconductor chips are electrically connected to outwardly routed terminals and, given a plurality of chips, are electrically interconnected by means of contact tracks. The cavity between housing cover and baseplate may be filled with a potting compound, for example an insulating gel. With a free gas volume in the housing, there is the risk in the longer term of the gel detaching under its own weight from the surface of the electronic components and, consequently, no longer being able to ensure high-voltage insulation.

These modules may be part of a power converter circuit arrangement. If a short circuit occurs in such a circuit arrangement, then it may destroy parts of the circuit arrangement. A short circuit in a module can easily lead to explosion of the module if suitable countermeasures are not taken.

The article "Reliable 1200 Amp 2500 V IGBT Modules for Traction Applications", IEE IGBT Propulsion Drives Colloquium, London, 25th April 1995 therefore proposes providing the housing with desired breaking points which limit the maximum pressure in the module. The housing ruptures at these desired breaking points in the event of an explosion, and gel or parts of the module can escape through the opening formed. However, housing parts flying around or gel hurled out constitute an undesirable source of danger. Material is sprayed around, contaminating the surroundings, and may lead to total failure of the device.

SUMMARY OF THE INVENTION

Accordingly, one object of the invention is to provide a novel module which enables long-term insulation without any problems and is as insensitive as possible to explosion. This object is achieved, in the case of a power semiconductor module of the type mentioned in the introduction, by means of the features of the first claim.

The core of the invention, then, is that a layer of foam is arranged under the housing cover in the housing. Foam not only enables mechanical support of the gel, so that the latter is prevented from becoming detached, but it can also absorb a large pressure increase in the event of a short circuit by virtue of compression. In this way, a compensating volume is created without the housing being destroyed.

The housing remains closed and no material is hurled into the surroundings.

The foam can be used in combination with a potting compound or alternatively, given filling with an insulating gas (for example $SF_6$), may completely replace the insulation gel. Particularly favorable properties are obtained by admixing flame-retardant substances, for example boron compounds, with the filling gas.

Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
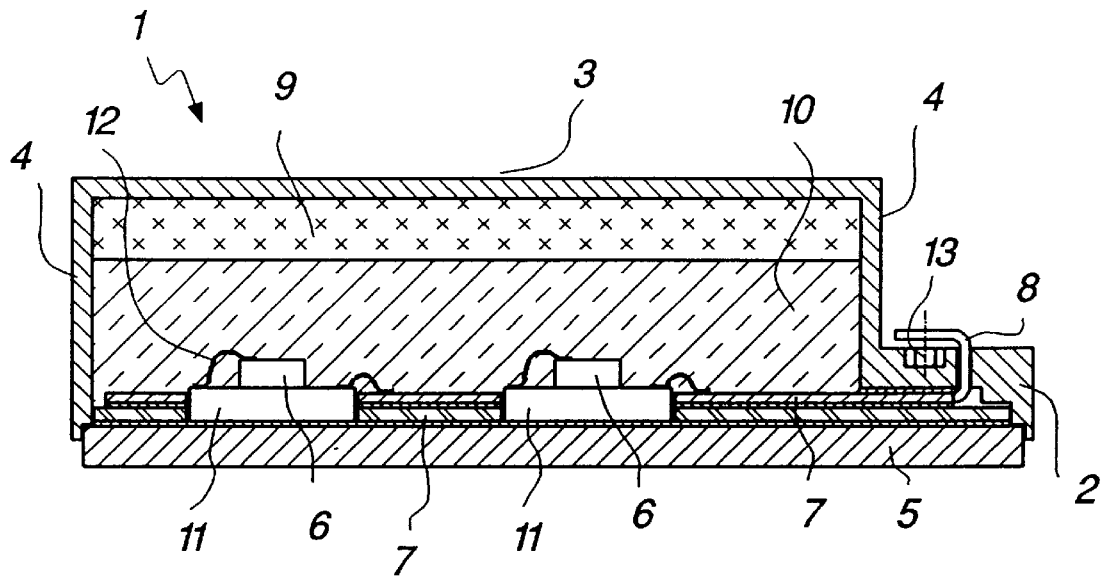
FIG. 1 shows a first exemplary embodiment of the invention in section.

The reference numerals used in the drawings and their meanings are summarized in the List of Designations.

DESCRIPTION OF THE PREFERRED EMBODIMENTS

Referring now to the drawings, wherein like reference numerals designate identical or corresponding parts throughout the several views, FIG. 1 shows a first exemplary embodiment of the invention in section. The power semiconductor module 1 comprises a housing 2. Semiconductor chips 6 are arranged on a baseplate 5. A substrate 11, for example made of a solderable ceramic, may be inserted between the semiconductor chips 6 and the baseplate 5, which may also serve as a heat sink. Contact tracks 7 are additionally provided; on the one hand, they establish the electrical contact between the semiconductor chips 6, and, on the other hand, they establish the electrical contact to outwardly routed terminals 8. In the exemplary embodiment shown the contact tracks 7 are arranged one above the other. The electrical connection between the terminals of the chips 6 and the contact tracks 7 can be effected by means of bonding wires 12, for example. Further contact-making possibilities are also conceivable, however. The terminal 8 may, for example in the manner illustrated, be a screw-type terminal with a fastening nut 13.

The cavity that is essentially formed by the housing cover 3, the housing walls 4 and the baseplate is filled in the direction of the baseplate with a potting compound 10, as is explained in the prior art mentioned in the introduction. This gel has, in particular, the task of insulation. According to the invention, the cavity is filled with a foam 9 in the direction toward the housing cover 3. The foam 9 may be chosen such that it supports the insulation gel 10 and, in the long term, prevents the latter from becoming detached. In addition, the foam 9 constitutes a compensating volume which absorbs the energy released in the event of a short circuit.

Figure 2:
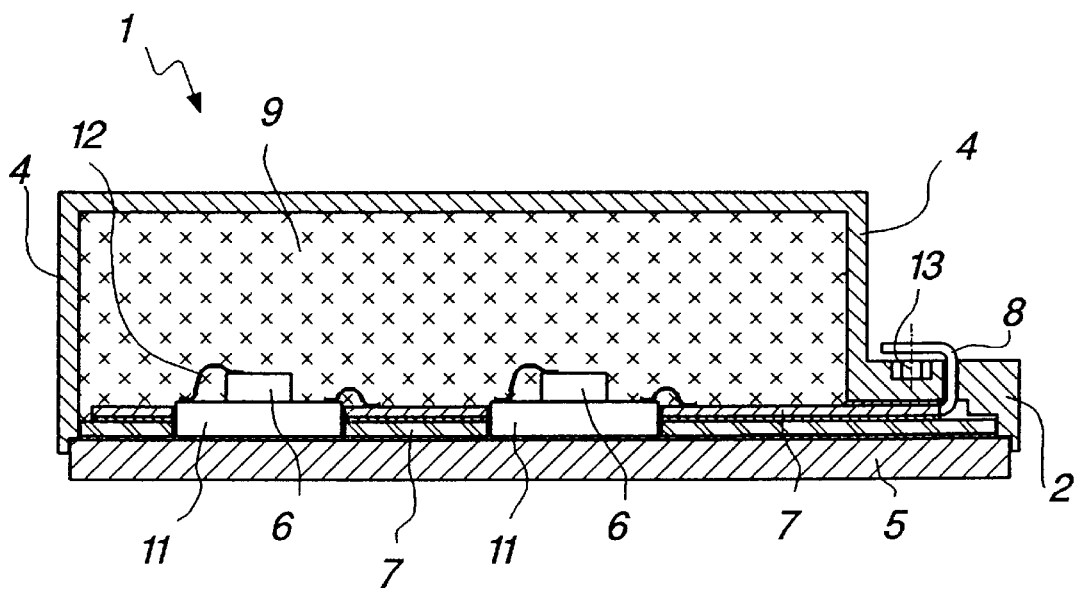
FIG. 2 shows a second exemplary embodiment of the invention in section.

Filling the housing with foam permits the requisite amount of insulation gel to be minimized. If the foam is additionally filled with a gas having a high breakdown strength (for example $SF_6$), then it is possible to replace the insulation gel completely by the foam. FIG. 2 shows such an example. Depending on the realization of the foam, the latter also forms good moisture protection. Compared with the prior art, the moisture protection is already improved just by using foamed housings. In addition, a flame-retardant substance such as, for example, boron compounds may be admixed with the filling gas of the foam. As a result, the risk of fire in the event of a short circuit is greatly diminished. Moreover, the foams are cheap and can be integrated into existing production processes in a simple manner.

Silicone foams have proved to be worthwhile as the foam. Silicone foams of the 800 series from Dow Corning are non-flammable and temperature-resistant up to 205° C. They are very elastic to very hard, depending on the type. Typically, approximately two-thirds of the foam volume is composed of gas. If, in the module structures according to the prior art mentioned in the introduction, the hard rubber (volume approximately 80 $cm^3$) that is used is replaced by silicone foam, then the foam acts similarly to a free gas volume of approximately 50 cm³ in the event of a short circuit. If the potting compound (volume approximately 100 cm³) is also replaced, then the free gas volume can be increased up to approximately 120 cm³.

The invention thus makes it possible to produce a power semiconductor module which enables long-term insulation without any problems and is as insensitive as possible to explosion. In the event of a short circuit, it is no longer possible for any parts to be hurled from the housing and, where applicable, insulation gel is kept fixed in a positively locking manner.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power semiconductor module, comprising:
   a housing having housing walls and a housing cover; and
   a baseplate arranged in said housing having at least one semiconductor chip arranged thereon;
   wherein a layer of foam is arranged under the housing cover in the housing, and
   wherein the foam is filled with a filling gas having a high electrical breakdown strength.

2. The module as claimed in claim 1, wherein a potting compound (10) in particular an insulating gel, is provided in a cavity between the housing walls, housing cover and the baseplate, and the layer of foam is arranged between the potting compound and the housing cover.

3. The module as claimed in claim 1, wherein the foam substantially completely fills a cavity between the housing walls, the housing cover and the baseplate.

4. The module as claimed in one of claims 2, 3 or 1, wherein the foam is essentially composed of silicone foam.

5. The module as claimed in claim 1, wherein a flame-retardant substances is admixed with the filling gas.

6. The module as claimed in claim 1, comprising:
   said housing enclosing each said semiconductor chip; and
   said layer of foam extending substantially from one wall to an opposing, wall of said housing.

7. The module as claimed in claim 1, wherein said gas comprises $SF_6$.

8. A semiconductor module, comprising:
   a baseplate having at least one semiconductor element disposed thereon;
   a housing having sidewalls and a cover disposed on said baseplate and enclosing said semiconductor element; and
   a layer of foam disposed inside of said housing and extending substantially from one sidewall to an opposing sidewall.

9. The module as claimed in claim 8, wherein said layer of loam substantially completely fills said housing.

10. The module as claimed in claim 8, comprising:
    a potting compound formed on said semiconductor chip; and
    said foam disposed on said compound and over said semiconductor chip.

11. The module as claimed in claim 8, wherein said foam contains a gas having a high electrical breakdown strength.

12. The module as recited in claim 11, wherein said gas comprises $SF_6$.

13. The module as recited in claim 11, wherein a flame-retardant substance is admixed with said gas.

14. The module as recited in claim 13, wherein said substance comprises a boron compound.

15. The module as claimed in claim 8, wherein said foam contains a flame-retardant substance.

16. The module as recited in claim 15, wherein said substance comprises a boron compound.

17. The module as recited in claim 8, wherein said foam is essentially composed of a silicone foam.

18. The module as claimed in claim 5, wherein said substance comprises a boron compound.

* * * * *